(12) United States Patent
Bertagnolli et al.

(10) Patent No.: US 8,939,108 B2
(45) Date of Patent: Jan. 27, 2015

(54) PROCESSING SYSTEM

(71) Applicant: Carl Zeiss Microscopy GmbH, Jena (DE)

(72) Inventors: Emmerich Bertagnolli, Vienna (AT); Heinz Wanzenboeck, Vienna (AT); Wolfram Buehler, Hermaringen (DE); Camille Stebler, Fehren (CH); Ulrike Zeile, Heidenheim (DE); Alexander Rosenthal, Kempen (DE)

(73) Assignee: Carl Zeiss Microscopy GmbH (DE)

( * ) Notice: Subject to any disclaimer, the term of this patent is extended or adjusted under 35 U.S.C. 154(b) by 0 days.

(21) Appl. No.: 13/708,936

(22) Filed: Dec. 8, 2012

(65) Prior Publication Data

US 2013/0098292 A1 Apr. 25, 2013

Related U.S. Application Data

(63) Continuation of application No. 12/378,634, filed on Feb. 18, 2009, now abandoned.

(30) Foreign Application Priority Data

Feb. 18, 2008 (DE) .......................... 10 2008 009 640

(51) Int. Cl.
*C23C 16/00* (2006.01)
*C23C 16/48* (2006.01)
(Continued)

(52) U.S. Cl.
CPC .............. *C23C 16/486* (2013.01); *H01J 37/16* (2013.01); *H01J 37/20* (2013.10); *H01J 37/30* (2013.01);
(Continued)

(58) Field of Classification Search
CPC ..... C23C 16/486; C23C 16/487; H01J 37/16; H01J 37/20; H01J 37/30; H01J 37/3056; H01J 2237/188; H01J 2237/2002; H01J 2237/31744
USPC ........................................ 118/723 FE, 723 FI
See application file for complete search history.

(56) References Cited

U.S. PATENT DOCUMENTS 4,000,426 A * 12/1976 Zaitseva et al. ........... 250/453.11
4,197,455 A    4/1980 Blanchard et al.
(Continued)

FOREIGN PATENT DOCUMENTS

DE          40 29 483 C1    5/1991
DE          102 08 043 A1   9/2003
(Continued)

OTHER PUBLICATIONS

Ray V., "Gas delivery and virtual process chamber concept for gas-assisted material processing in a focused ion beam system", Journal of Vacuum Science and Technology B: Microelectronics and Nanometer Structures—Nov. 2004—vol. 22, Issue 6, pp. 3008-3011.
(Continued)

*Primary Examiner* — Keath Chen
(74) *Attorney, Agent, or Firm* — Alston & Bird LLP

(57) ABSTRACT

A processing system for processing an object (3) is provided, wherein the processing system is adapted, to focus a first energy beam, in particular an electron beam (11), and a second energy beam, in particular an ion beam (21), on a focusing region (29) in which a object (3) to be processed is arrangeable. A processing chamber wall (35) having two openings (38, 39) for traversal of both energy beams and a connector (37) for supplying process gas delimits a processing chamber (45) from a vacuum chamber (2) of the processing system. Processing the object by activating the process gas through one of the energy beams and inspecting the object via one of the energy beams is enabled for different orientations of the object relative to a propagation direction of one of the energy beams.

37 Claims, 6 Drawing Sheets

(51) Int. Cl.
　　*H01J 37/16*　　(2006.01)
　　*H01J 37/20*　　(2006.01)
　　*H01J 37/30*　　(2006.01)
　　*H01J 37/305*　　(2006.01)

(52) U.S. Cl.
　　CPC ........... *H01J 37/3056* (2013.01); *C23C 16/487* (2013.01); *H01J 2237/188* (2013.01); *H01J 2237/2002* (2013.01); *H01J 2237/31744* (2013.01)
　　USPC ............................. 118/723 FI; 118/723 FE

(56) References Cited

U.S. PATENT DOCUMENTS

| | | |
|---|---|---|
| 4,698,236 A | 10/1987 | Kellogg et al. |
| 5,055,696 A | 10/1991 | Haraichi et al. |
| 5,229,607 A | 7/1993 | Matsui et al. |
| 5,435,850 A | 7/1995 | Rasmussen |
| 5,574,280 A | 11/1996 | Fujii et al. |
| 5,798,529 A | 8/1998 | Wagner |
| 5,851,413 A | 12/1998 | Casella et al. |
| 5,906,857 A * | 5/1999 | McKee et al. ................ 427/8 |
| 6,314,986 B1 | 11/2001 | Zheng et al. |
| 6,414,307 B1 | 7/2002 | Gerlach et al. |
| 6,522,717 B1 | 2/2003 | Murakami et al. |
| 6,787,783 B2 | 9/2004 | Marchman et al. |
| 6,838,380 B2 | 1/2005 | Bassom et al. |
| 6,855,938 B2 | 2/2005 | Preikszas et al. |
| 7,435,973 B2 | 10/2008 | Koops et al. |
| 2002/0152797 A1 | 10/2002 | McAndrew et al. |
| 2002/0170675 A1 | 11/2002 | Libby et al. |
| 2002/0190036 A1 | 12/2002 | McCay et al. |
| 2005/0103272 A1 | 5/2005 | Koops et al. |
| 2005/0167614 A1 | 8/2005 | Kaito |
| 2006/0225998 A1 | 10/2006 | Song |
| 2006/0284090 A1 | 12/2006 | Koops et al. |
| 2007/0187622 A1 | 8/2007 | Nagano |

FOREIGN PATENT DOCUMENTS

| | | |
|---|---|---|
| EP | 0 483 517 A2 | 5/1992 |
| EP | 1 180 638 A2 | 2/2002 |
| EP | 1 411 538 A1 | 4/2004 |
| FR | 2 408 909 | 6/1979 |
| KR | 2002 0 014 761 | 2/2002 |
| WO | 97/49116 | 12/1997 |
| WO | 2006/025968 | 3/2006 |

OTHER PUBLICATIONS

Theil J.A., "Gas distribution though injection manifolds in vacuum systems", Journal of Vacuum Science & Technology A: Vacuum, Surfaces, and Films—Mar. 1995—vol. 13, Issue 2, pp. 442-447.
Dissertation of Tristan Bret, "Physico-Chemical study of the focused electron beam induced deposition process", EPFL, Lausanne, Switzerland, 2005.
Shinji Matsui and Katsui Mori, "Direct writing onto Si by electron beam stimulated etching", Applied Physics Letters, AIP, American Institute of Physics, Melville, NY, US, vol. 51, No. 19, Nov. 9, 1987, pp. 1498-1499.
European Search Report dated Mar. 30, 2010 in Application No. EP 09 00 2286 (4 pages).

* cited by examiner

PROCESSING SYSTEM

RELATED APPLICATIONS

This application is a continuation of pending U.S. patent application Ser. No. 12/378,634 filed 18 Feb. 2009, the entire content of which is incorporated herein by this reference.

PRIORITY APPLICATION

This application claims priority benefit of German Patent Application No. 10 2008 009 640.7, filed Feb. 18, 2008, the entire content of which is hereby incorporated by this reference.

FIELD OF THE INVENTION

The present application relates to a processing system for processing an object in the presence of a process gas. In particular, the present application relates to a two-beam processing system being adapted at least for generating and focussing a pair of energy beams which energy beams may comprise an electron beam, an ion beam and a photon beam.

BRIEF DESCRIPTION OF RELATED ART

Processing systems are employed in methods for material processing by material deposition from gases, such as CVD (Chemical Vapour Deposition) or by material ablation upon supply of reaction gases. In such processing methods a reaction gas is activated by an electron beam, an ion beam or a photon beam to cause material deposition or to cause material ablation at a region of the object to be processed.

A conventional inspection and processing system comprising an electron microscopic system and an ion beam system is for example known from U.S. Pat. No. 6,855,938 B2. Thereby beam axes of an ion beam column and an electron beam column are arranged enclosing an angle in-between and the system comprises focussing optics for focussing the ion beam and the electron beam at a scanning region. Such a system may for example be utilised for analysis of a previously manufactured semiconductor structure. Upon orthogonal incidence of the ion beam onto the semiconductor structure for example a trench may be cut into the structure and using an electron beam running transverse to the ion beam a sidewall of the trench may be inspected. Thereby for example a layer sequence in the manufactured semiconductor structure may be analyzed for quality control. However, this conventional system does not allow processing the object in the presence of a reaction gas.

A conventional material processing system comprising a gas supply system for material deposition and material ablation is for example known from US 2006/0284090 A1. Thereby, the material processing system comprises an electron beam column for generating an electron beam and focussing the electron beam in an object region in which the object to be processed is arrangeable. For supplying a reaction gas to the object region the system further comprises a gas supply system formed by gas nozzles.

Due to increasing miniaturizing of semiconductor components the requirements for processing systems for processing and inspecting such semiconductor structures enhance. In particular higher and higher requirements are imposed on a positioning accuracy of structures within the semiconductor material. Thereby, there is in particular a demand to improve, regarding their accuracy, processing systems operating in the presence of a reaction gas.

When large amounts of process gas are present within the vacuum chamber of the processing system damage due to the reactive gas may occur (deposition and/or corrosion of the components of the beam optics). Often long evacuation times are required, before the object may be inspected in the absence of the process gas.

SUMMARY OF THE INVENTION

In view of the above, it is an object of the invention, to provide a processing system for processing an object which at least partly obviates the previously mentioned disadvantages. It is a further object to provide a flexible particle optical processing system which enables processing the object in a variety of ways and simultaneously enables inspecting the object.

According to an embodiment of the invention, a processing system for processing an object is provided which comprises a first energy beam guiding system having a first beam optics for generating a first energy beam and focussing the same in a focussing region arranged in a vacuum chamber; a second energy beam guiding system having a second beam optics for generating a second energy beam and focussing the same in the focussing region; and at least one processing chamber wall arrangeable within the vacuum chamber such that the processing chamber wall at least partially encompasses the focussing region, wherein the processing chamber wall comprises a front face surrounding, in particular enclosing, the first energy beam and the second energy beam, the front face facing the object; the processing chamber wall further comprises at least one connector for supplying process gas to the focussing region; an opening for traversal of the first energy beam; and an opening for traversal of the second energy beam. Thereby, the first energy beam guiding system is formed by optical components or is adapted as particle beam column and the first energy beam comprises one of a photon beam, an electron beam and an ion beam. Further, the second energy beam guiding system is configured as at least one of an electron beam column and an ion beam column and the second energy beam comprises one of an electron beam and an ion beam.

Thereby, the processing chamber wall may comprise one connector for supplying process gas to the focussing region or also multiple connectors, potentially at different wall sides or regions for supplying multiple (different) process gases to the focussing region.

According to an embodiment, the processing system further comprises an object holder for holding the object, wherein the object holder is adapted, to change an orientation of the object relative to a beam direction of the first energy beam from a first orientation to a second orientation different from the first orientation, wherein the processing chamber wall is configured such that both in the first orientation and in the second orientation one of the following holds: a gap is formed between the front face of the processing chamber wall and the object; the front face of the processing chamber wall abuts on the object. In particular, the processing chamber wall delimits a processing chamber containing the object to be processed from a vacuum chamber of the processing system in the first orientation of the object as well as in the second orientation of the object. In the processing chamber a concentration of process gas supplied via the connector may considerably be higher (such as 10 times, 100 times, or 1000 times) than the concentration of the process gas in other parts of the vacuum chamber housing the processing system. The processing chamber wall may comprise one or more processing chamber wall portions.

According to an exemplary embodiment, the gap formed between the front face of the processing chamber wall and the object may have a width of less than 2 mm, in particular less than 0.5 mm, further in particular less than 200 μm. The width or distance between the front face and the object may differ at different positions of the object.

According to an embodiment, the front face of the processing chamber wall contacts the object or an object holder holding the object. Thereby, the process gas within the processing chamber delimited by the processing chamber wall may effectively be maintained within the processing chamber by the thus provided sealing effect between the front face and the object or the object holder.

According to an embodiment, the first energy beam guiding system is adapted as an electron beam column and the first energy beam comprises an electron beam, the second energy beam guiding system is adapted as an ion beam column and the second energy beam comprises an ion beam.

According to a further exemplary embodiment, a particle optical processing system for processing an object comprises an electron beam column, an ion beam column and a processing chamber wall. The electron beam column is equipped with an electron optics for generating an electron beam and focussing the same in a focussing region arranged within a vacuum chamber. The ion beam column is equipped with an ion optics for generating an ion beam and focussing the same in the focussing region. The processing chamber wall is arrangeable within the vacuum chamber such that the processing chamber wall at least partially encompasses the focussing region. The processing chamber wall of this embodiment may exhibit a front face surrounding, in particular enclosing, the electron beam and the ion beam, the front face facing the object; a connector for supplying process gas to the focussing region; an opening for traversal of the electron beam; and an opening for traversal of the ion beam.

The focussing region may correspond to at least a part of an object plane of the electron beam column or the ion beam column. The part of the object plane thereby may correspond to a scanning region of the particle beams. Both particle beam columns may comprise a scanning system having deflection elements to guide the corresponding particle beam across the scanning region, for example line by line or column by column.

The electron optics may comprise a magnetic lens and/or an electrostatic lens, in particular a magnetic lens having an electrostatic immersion lens. The magnetic lens may comprise two pole pieces forming a pole piece gap arranged axially or transversely relative to an axis of the electron beam. The electron optics may further include a beam tube adapted as anode onto which a high positive voltage (for example +8 kV) may be applied during operation. The electron optics may further comprise an electrode onto which a suitable potential (for example 0 V to 50 V) may be applied, wherein the electrode (also called termination electrode) is arranged between the beam tube adapted as anode and the object to be processed of inspected. Thus, the electron beam column enables to generate electrons, to accelerate the electrons to a high kinetic energy and to decelerate the electrons to a relatively low kinetic energy before incidence in the focussing region at the surface of the object.

According to an embodiment, the processing system further comprises at least one electron detector for detecting electrons emanating from the object. The electrons emanating from the object may comprise backscatter electrons and/or secondary electrons. Using a scanning system and the electron detector an electron microscopic image of the object to be examined may be acquired.

The ion beam column may comprise electrostatic lenses and magnetic lenses. Further, the ion beam column comprises an ion source including a reservoir of solid material or a reservoir of liquid material and/or including a gas supply. From the reservoir of solid material or the reservoir of liquid material materials, such as liquid gallium, may be extracted by thermal activation and using an extractor electrode which generates an electric field. Via the gas supply gaseous elements or molecules may be supplied. After ionising the particles extracted from the reservoir of solid material or the reservoir of liquid material or the particles supplied via the gas supply the particles are accelerated by a suitable electric field to form the ion beam.

A beam axis of the electron beam column and a beam axis of the ion beam column may in particular include an angle which is greater than 10°. This angle may however also be smaller than 10°, as long as the electron beam column and the ion beam column are adapted, to focus the electron beam and the ion beam in the same focussing region.

Together with a surface of the object to be processed the processing chamber wall may delimit a processing chamber within the vacuum chamber, wherein the processing chamber may contain process gas in an enhanced concentration when compared to the concentration within the vacuum chamber. Thereby, the focussing region is situated within the such delimited processing chamber.

The processing chamber wall may exhibit different shapes. The processing chamber wall may for example comprise a bowl shape, a shape of a cylindrical shell or a dome shape. The processing chamber wall may comprise elastic, flexible materials, wherein the processing chamber wall may be integrally formed or may be manufactured from several separate elements. The front face of the processing chamber wall facing the object may annularly enclose the electron beam and the ion beam, wherein an annular shape is not necessarily a circular shape, but may for example also comprise a rectangular shape, a quadratic shape, a ellipse shape and the like.

The connector provided in the processing chamber wall for supplying process gas to the focussing region enables to provide process gas in the vicinity of the focussing region. Using the electron beam and/or the ion beam and/or the photon beam the process gas may be activated, to thus process the object. For traversal of the electron beam and for traversal the ion beam from their respective sources towards the focussing region corresponding openings are provided in the processing chamber wall.

Plural openings for beam traversal may be provided, for example for different orientations or lateral positions of the object.

Thus the particle optical processing system allows in an advantageous way processing an object in the presence of a process gas by activating the process gas by the electron beam and/or the ion beam and/or the photon beam and the particle optical processing system allows also inspecting the object using the electron beam and/or the ion beam and/or the photon beam.

According to an embodiment, the front face of the processing chamber wall substantially extends in a plane. In cases, where the front face is not entirely located in a plane, but the front face exhibits deviations from a plane, the plane in which the front face is substantially located may for example be defined by a fitting plan representing a good approximation of a shape of the front face of the processing chamber wall. Thus, not all portions of the front face need to be located in the fitting plane, but may be located outside the fitting plane. A major portion of the front face may however be considered, to define a fitting plane having small deviations from the front face of the processing chamber wall. During operation of the processing system the fitting plane of the front face of the processing chamber wall may substantially extend parallel to a surface of the object to be processed.

The processing chamber wall partially extends transverse to the fitting plane. By arranging the processing chamber wall such that it partially extends transverse to the plane a processing chamber is formed comprising a space located above the focussing region. In this processing chamber a supplied process gas is delimited from the vacuum chamber of the processing system by the processing chamber wall and thus may be maintained at a relatively high concentration compared to its concentration within the vacuum chamber.

According to an embodiment, the processing chamber wall further comprises a connector for discharging gas from the focussing region. The process gas thereby may be discharged from the focussing region and thus from the processing chamber to terminate processing the object using the process gas or to remove process gas that has reacted with the object or to remove purge gas.

According to an embodiment, the processing chamber wall is adapted, to be arranged facing the object such that the gap between the object and the front face has a width of less than 2 mm, in particular less than 2.5 mm, further in particular less than 200 µm, still further in particular less than 20 µm.

According to another embodiment, the processing chamber wall or the front face of the processing chamber wall may contact the object or may contact an object holder holding the object. Thereby, the processing chamber wall is set without a gap, and thus in a flush way, on the object. This may be achieved by a mechanical spring mechanism or an elastic material between object or object holder and processing chamber wall. In other embodiments the processing chamber wall and in particular the front face of the processing chamber wall may contact the object or the object holder at plural contact points, such as three or more contact points, and in other portions of the front face of the processing chamber wall a gap is formed between the object and the processing chamber wall.

When the object and the processing chamber wall contact each other or when a gap having a small width is provided in-between a processing chamber may effectively be delimited from the vacuum chamber to avoid that the vacuum chamber and components of the processing system situated therein are exposed to process gas to an excessive degree. Thus, damage of these components of the processing system may be reduced and a reliable operation of the processing system may be ensured.

According to an embodiment, the at least one processing chamber wall comprises a first processing chamber wall and a second processing chamber wall which are alternatively arrangeable within the vacuum chamber, wherein the first processing chamber wall is adapted, to form the gap in the first orientation of the object, and wherein the second processing chamber wall is adapted, to form the gap in the second orientation of the object. This embodiment may in particular be advantageously employed in cases, where only two orientations of the object must be set for processing and inspecting the object. Thereby, the first processing chamber wall and the second processing chamber wall may be constructed in a particular simple and cost effective way and may be alternatively arranged for different orientations of the object, to at least partially encompass the focussing region and thus to form the processing chamber. For example, the first processing chamber wall and the second processing chamber wall may substantially be orthogonally displaceable relative to one of the particle beam directions for removal and/or insertion.

According to an embodiment, the front face is adapted to surround the object in the first orientation and in the second orientation and the front face and the object holder are adapted, to contact each other in the first orientation and the second orientation. Thus, the front face of the processing chamber wall is flush with the object holder, to effectively form a gas sealing.

According to an embodiment, the at least one processing chamber wall comprises a first processing chamber wall and a second processing chamber wall which are alternatively arrangeable within the vacuum chamber, wherein the front face of the first processing chamber wall is adapted, to contact the object holder in the first orientation of the object, and wherein the front face of the second processing chamber wall is adapted, to contact the object holder in the second orientation of the object.

According to an embodiment, the processing chamber wall comprises at least two wall portions being displaceable relative to each other of which a first wall portion comprises the opening for the first energy beam and the opening for the second energy beam and of which a second wall portion provides at least a part of the front face facing the object. The first wall portion of the processing chamber wall thereby may be fixedly, for example directly or indirectly, connected to the electron beam column and/or the ion beam column, to ensure that a position of the opening for traversal of the ion beam and a position of the opening for traversal of the electron beam is substantially unchanged for different orientations of the object. The gap between the object or the object holder and the front face of the processing chamber wall or a gap free sealing face may thereby be partially formed by the second processing wall portion and the object.

According to an embodiment, the first wall portion and the second wall portion are pivotable relative to each other around a pivoting axis. Thereby it is enabled, to form the gap between the object or the object holder and the front face of the processing chamber wall for different orientations of the object with substantially unchanged width. Thus, a processing chamber is formed for different orientations of the object.

According to an embodiment, the first wall portion and the second wall portion are partially overlapping arranged side by side. An amount of overlap of the first wall portion and the second wall portion may be different for different orientations of the object. In the overlap region between the first wall portion and the second wall portion a sealing element may be arranged, to provide an effective sealing for process gas, such as for example via a gap free abutment in overlap regions. In particular a region of the first wall portion which does not overlap with the second wall portion in any of the orientations of the object to be set may be equipped with the connector for supplying the process gas as well as with a connector for discharging the process gas.

According to a further embodiment, the first wall portion and the second wall portion are elastically connected to each other by a third wall portion. The third wall portion may for example comprise an elastic, flexible material or may for example comprise a bellows, to enable a necessary shape change of the processing chamber wall for different orientations of the object. Also, the third wall portion may comprise elements that are telescopically displaceable into each other.

BRIEF DESCRIPTION OF THE DRAWINGS

Embodiments of the present invention are now described referring to the accompanying drawings.

DETAILED DESCRIPTION OF EXEMPLARY EMBODIMENTS

Figure 1A:
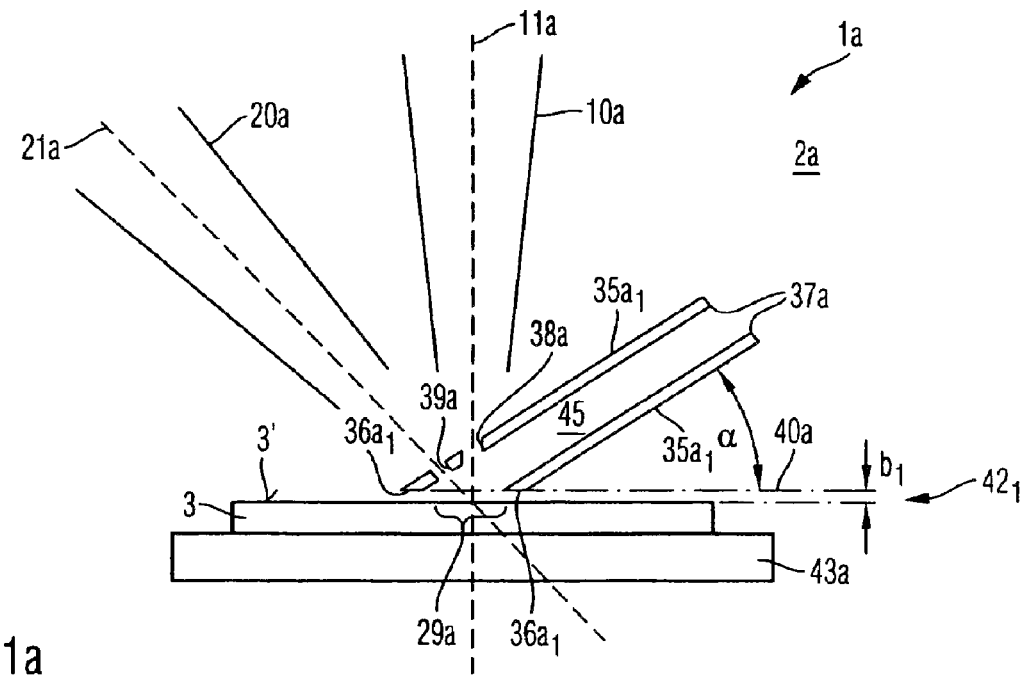
FIGS. 1a and 1b schematically show an embodiment of a particle optical processing system.
Figure 1B:
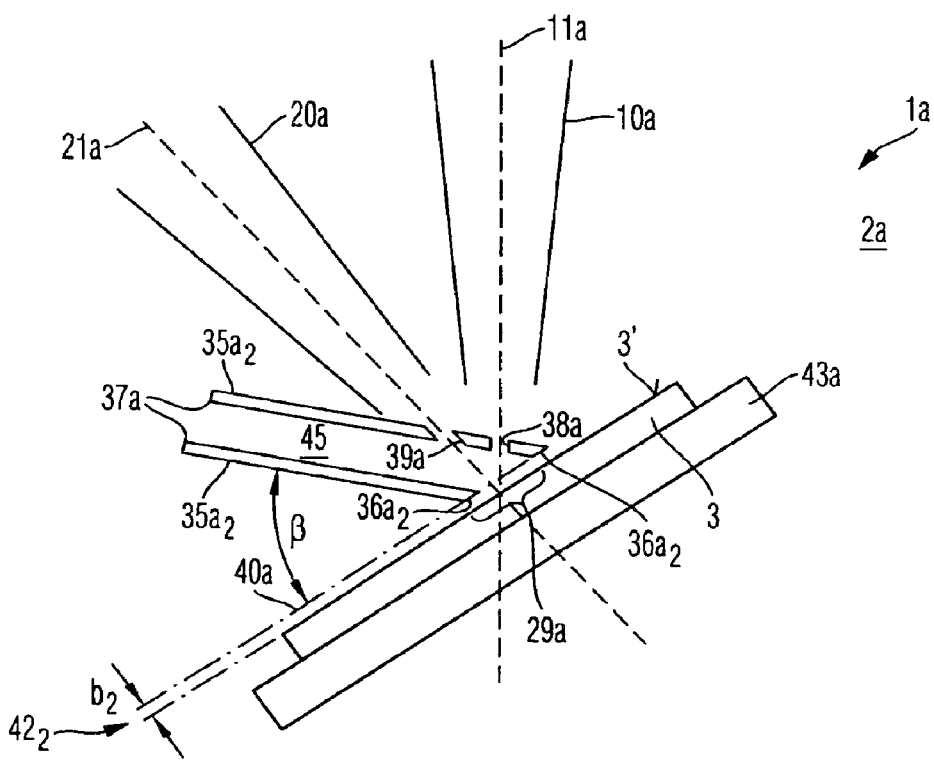

FIGS. 1a and 1b schematically show sectional views of a particle optical processing system 1a for two different orientations of the object 3 relative to an axis 11a of an electron beam column 10a.

The particle optical processing system 1a comprises an electron beam column 10a for generating an electron beam 11a and an ion beam column 20a for generating an ion beam 21a. The electron beam column 10a as well as the ion beam column 20a are known from the prior art. For example, the electron beam columns 10a and the ion beam column 20a may be constructed as in U.S. Pat. No. 6,855,938 B2 illustrated in FIG. 8 and described in the text. The disclosure of U.S. Pat. No. 6,855,938 B2 is entirely incorporated by reference into the present application. The electron beam column 10a comprises an electron optics, to focus the electron beam within the vacuum chamber 2a in a focussing region 29a. Similarly the ion beam column 20a comprises an ion optics, to focus the ion beam 21a in the focussing region 29a.

Both particle beam columns each comprise a scanning system for deflecting the particle beams in a controlled way, to scan the focussed particle beams across the focussing region 29a. Thus, processing and inspecting a predefined region of the object 3 arranged in the focussing region is enabled.

In the example illustrated here the ion beam column 20a comprises a not illustrated ion source in which liquid gallium is extracted from a reservoir of liquid material and in which the extracted gallium is ionised. The object 3 is hold on the object holder 43a such that the surface 3' of the object 3 comprises the focussing region 29a. In FIG. 1a the surface 3' of the object 3 is oriented in a first orientation relative to the beam axis of the electron beam column 10a, wherein a normal of the surface 3' of the object 3 substantially runs parallel to the beam axis of the electron beam column 10a. In this orientation of the surface 3' of the object 3 the particle optical processing system 1a comprises a first processing chamber wall $35a_1$ being adapted as a cylindrical tube. The cylinder may be adapted as an elliptic, circular or a general cylinder. In the sectional view of FIG. 1a the cylindrical tube $35a_1$ includes an angle α with the surface 3' of the object 3, wherein the angle α is about 35°. In other embodiments, the angle α may assume larger or smaller values. In particular, the angle α may be selected depending on the application.

The cylindrical tube $35a_1$ exhibits a front face $36a_1$ formed by cutting the cylinder with a plane and is arranged opposite to the surface 3' of the object 3 such that a gap $42_1$ is formed between the front face $36a_1$ of the processing chamber wall $35a_1$ and the surface 3' of the object 3. The width b of the gap $42_1$ amounts to less than 200 µm, in particular less than 20 µm. In other embodiments the front face $36a_1$ abuts on the surface 3' of the object 3 or on the object holder 43, for example via an elastomer lip. The front face $36a_1$ surrounds the electron beam 11a and the ion beam 21a.

The first processing chamber wall $35a_1$ comprises a connector 37a for supplying process gas to the focussing region 29a. In particular, process gas is supplied to the space 45 (also referred to as processing chamber) delimited from the vacuum chamber 2a. The processing chamber 45 is delimited from the vacuum chamber 2a by the processing chamber wall $35a_1$.

The first processing chamber wall $35a_1$ exhibits an opening 38a for traversal of the electron beam 11a to the focussing region. Further the first processing chamber wall $35a_1$ exhibits an opening 39a for traversal of the ion beam 21a to the focussing region 29a. Shapes of both openings 38a and 39a may be adapted in dependence of the orientation of the processing chamber wall $35a_1$ relative to the directions of the electron beam 11a or the ion beam 21a. Thus, the particle optical processing system 1a allows, to direct the electron beam 11a and the ion beam 21a to the focussing region 29a in which the surface 3' of the object 3 is arranged in the presence of a process gas. At the same time the space 45 in which process gas is present in a relatively high concentration is delimited from other components arranged within the vacuum chamber 2a, in order not to deteriorate a function of these components due to the presence of process gas.

Electrons emanating from the surface 3' of the object 3 are detected by electron detectors not illustrated in FIGS. 1a and 1b. The electrons emanating from the object may comprise backscatter electrons and secondary electrons. The electron detectors may be arranged within the electron beam tube 10a (inline detectors) or may be arranged outside therefrom. The electrons emanating from the surface 3' of the object 3 may be released by illuminating the object 3 using the ion beam 21a and/or using the electron beam 11a. Alternatively, the detector may also be embedded into the processing chamber wall or may be fixed thereon. Evolving secondary particles (ions, electrons) may be drawn from the processing region towards the detectors by applying an extraction voltage.

By scanning the one or more focussed particle beams across the focussing region and detecting the released electrons an electron microscopy image of the region of the object 3 arranged in the focussing region 29a is obtained.

The process gas arriving via the gas connector 37a into the processing chamber 45 and thus in proximity of the focussing region 29a may be activated by the electron beam 11a and/or the ion beam 21a (or an alternative or additional photon beam), to process the object 3 within the focussing region 29a. The processing by the activated process gas may comprise ablating material from the surface 3' and/or deposition of material onto the surface 3' of the object 3. By supplying inert gas a protection of the object from reactive process gas may be achieved or a thermal treatment of the object may be performed.

FIG. 1b schematically shows the particle optical processing system 1a in a sectional view for a second orientation of the object 3 relative to the beam axis of the electron beam column 10a. For this second orientation a normal of the surface 3' of the object 3 substantially runs parallel to a beam axis of the ion beam column 20a. In this orientation a trench may be cut into the object 3 in a known way by illuminating using the ion beam 21a. Simultaneously a side face of the trench may be inspected using the electron beam 11a via inclined illumination. In the in FIG. 1b illustrated orientation of the object relative to the electron beam column 10a the particle optical processing system 1a comprises, instead of the first processing chamber wall $35a_1$ illustrated in FIG. 1a, a second processing chamber wall $35a_2$ different from the first processing chamber wall $35a_1$. The second processing chamber wall $35a_2$ is also adapted as a cylindrical tube. The second processing chamber wall $35a_2$ is adapted, to form a gap $42_2$ between the front face $36a_2$ of the second processing chamber wall $35a_2$ and the surface 3' of the object 3 in the second orientation of the surface 3' of the object 3 relative to the electron beam column 10a, as illustrated in FIG. 1b. The processing chamber wall $35a_2$ includes an angle β with the surface 3' of the object 3, wherein the angle β amounts to about 45° in the illustrated example. In particular, the angle β is different from the angle α, indicated in FIG. 1a. Thus, a shape of the front face $36a_2$ of the second processing chamber wall $35a_2$ differs from a shape of the front face $36a_1$ of the first processing chamber wall $35a_1$. The width $b_2$ of the gap $42_2$ illustrated in FIG. 1b is approximately equal to the width $b_1$ of the gap $42_1$ illustrated in FIG. 1a. Thus, the processing chamber 45 is sealed and delimited from the vacuum chamber 2a in both orientations of the object.

For traversal of the electron beam 11a from its source to the object the second processing chamber wall $35a_2$ exhibits an opening 38a and for traversal of the ion beam 21a the second processing chamber wall $35a_2$ exhibits an opening 39a. The shapes of these openings are different from the shapes of the openings 38a and 39a of the processing chamber wall $35a_1$. Further, the second processing chamber wall $35a_2$ comprises a connector 37a for supplying process gas into the space 45. Thus it is enabled, to inspect and to process the object 3 also in this second orientation, in analogy as described with reference to FIG. 1a.

The two orientations of the object 3 illustrated in FIGS. 1a and 1b differ by an angle of about 45°.

Depending on an application this angle may be larger or smaller. For example the angle between the two different orientations may amount to 10°, 20°, 30°, 40°, 50°, 60° g, 75° or may assume a value in-between.

In other embodiments, the processing chamber walls illustrated in FIGS. 1a and 1b are adapted, such that the first processing chamber wall $35a_1$ contacts the object 3 or the object holder 43a in a first orientation of the object and such that the second processing chamber wall $35a_2$ contacts the object 3 or the object holder 43a in a second orientation of the object. Thereby, the front face of the corresponding contacting processing chamber wall may for example comprise elastic materials, such as rubber seals. Thereby, the corresponding contacting processing chamber wall may be flush with a corresponding face of the object or the object holder or may contact this face at several contact points.

Figure 2A:
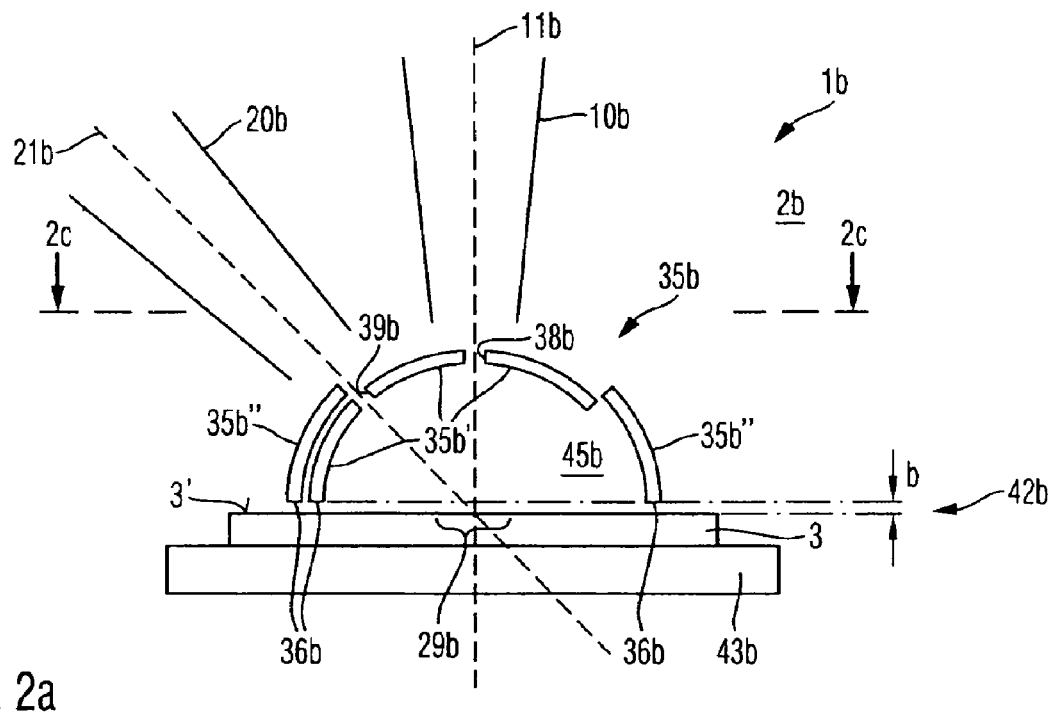
FIGS. 2a, 2b and 2c schematically show a further embodiment of a particle optical processing system.
Figure 2B:
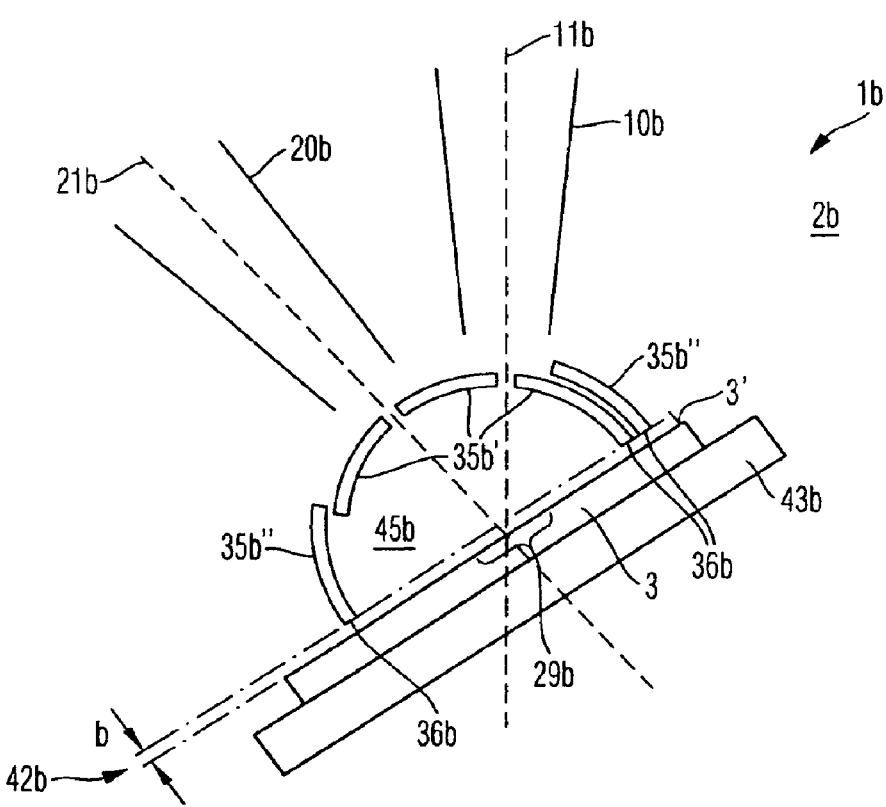
Figure 2C:
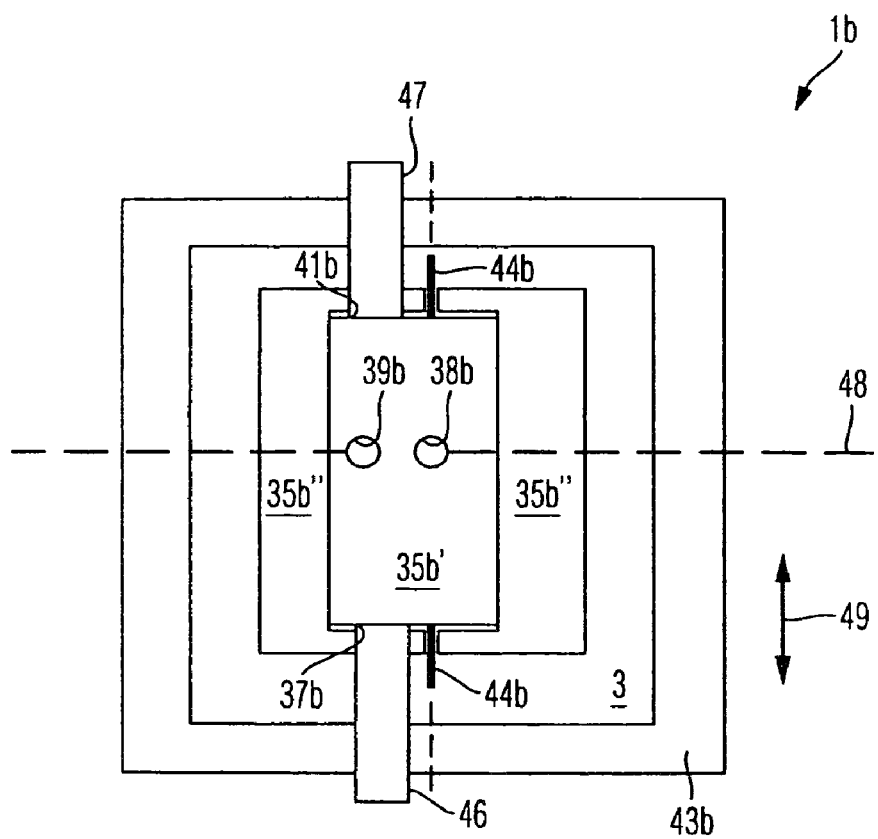

FIGS. 2a, 2b, and 2c schematically illustrate a further embodiment 1b of a particle optical processing system. As the particle optical processing system 1a illustrated in FIGS. 1a and 1b the particle optical processing system 1b comprises an electron beam column 10b for generating an electron beam 11b and focussing the same in the focussing region 29b, as well as an ion beam column 20b for generating an ion beam 21b and focussing the ion beam in the focussing region 29b.

The object 3 is hold at the object holder 43b, to achieve an orientation of the object 3 in which a normal of the surface 3' of the object 3 is aligned substantially parallel to the beam axis defined by a propagation direction of the electron beam 11b. The particle optical processing system 1b further comprises a first wall portion 35b' having an opening 38b for traversal of the electron beam 11b and having an opening 39b for traversal of the ion beam 21b. The processing chamber wall of the system 1b further comprises a second wall portion 35b" which is arranged such that a front face 36b of the processing chamber wall 35b faces the surface 3' of the object 3. Between the front face 36b and the surface 3' of the object 3 a gap 42b having a width b of smaller than 2 mm, in particular smaller than 200 µm, further in particular smaller than 20 µm, is formed. It is also possible that this width substantially vanishes so that no gap is formed between the front face and the surface of the object but such that the front face and the surface are flush with each other or comprise plural contact points. The second wall portion 35b" of the processing chamber wall 35b is pivotable around a pivoting axis 44b relative to the first processing chamber wall 35b' as illustrated in a plan view of the particle optical processing system 1b in FIG. 2c. FIGS. 2a and 2b however illustrate a sectional view of the processing system 1b so that the pivoting axis 44b is not visible. Further, in FIGS. 2a and 2b front and rear end faces of the processing chamber wall formed by the first wall portion 35b' and the second wall portion 35b" are not illustrated.

FIG. 2b schematically illustrates the particle optical processing system 1b in a sectional view in a second orientation of the object 3 relative to the electron beam column 10b. This second orientation of the object corresponds to the second orientation of the object which is shown in FIG. 1b. Compared to the processing chamber wall 35b illustrated in FIG. 2a the second wall portion 35b" is pivoted relative to the first wall portion 35b' around the pivoting axis 44b so that compared to the configuration illustrated in FIG. 2a other parts of the second wall portion 35b" overlap with the first wall portion 35b'. At the same time however, in spite of the changed orientation of the object 3 relative to the electron beam column 10b, a gap 42b is formed between the front face 36b and the surface 3' of the object 3, wherein the gap 42b has a substantially unchanged width b compared to the width of the gap 42b in the first orientation illustrated in FIG. 2a. Thus, in the exemplarily illustrated orientations shown in FIGS. 2a and 2b which differ by an angle of about 45° a demarcation of a processing chamber 45b from the vacuum chamber 2b is enabled, to allow processing the object in the presence of a sufficient concentration of process gas.

FIG. 2c schematically illustrates the particle optical processing system 1b in a plan view according to in FIG. 2a indicated directions 2c. The first wall portion 35b' comprises the two openings 38b and 39b for traversal of the electron beam 11b and the ion beam 21b, respectively. A front end face of the first wall portion 35b' (in the plan view of FIG. 2c a lower part of the first wall portion 35b') comprises one or more connectors 37b for supplying process gas (which may comprise a mixture of gases) via a connecting pipe 46. A rear end face of the first wall portion 35b' (in the plan view of FIG. 2c an upper part of the first wall portion 35b') comprises a connector 41b for discharging the process gas from the focussing region 29b via a discharge pipe 47.

The second wall portion 35b" is pivotable relative to the first wall portion 35b' around a pivoting axis 44b. Thereby, a discrimination of the processing chamber 45b from the vacuum chamber 2b may be achieved by a suitable relative rotation (pivoting) of the first wall portion 35b' and the second wall portion 35b". Thus, process gas for activation by the electron beam 11b and/or the ion beam 21b may be provided to the object 3, to cause depositions onto the surface 3' of the object 3 or to cause ablations of material from the surface 3' of the object 3 or to cause conversion of the material. Due to their substantially fixed positions of the openings 38b and 39b for traversal of the electron beam 11b and the ion beam 21b, respectively, such processing the object and also inspecting the object may be performed in different orientations of the object relative to the electron beam column 10b or the ion beam column 20b.

A partial pressure of the process gas within the processing chamber 45b thereby may be a factor of greater than 2, in particular greater than 5, further in particular greater than 20, higher than a partial pressure of the process gas in the vacuum chamber 2b.

In the FIGS. 2a, 2b, and 2c of the embodiment the first wall portion 35b' of the processing chamber wall 35b and the second wall portion 35b" of the processing chamber wall 35b partly assume a shape of a cylinder barrel. However, these wall portions may also assume another shape, as long as a relative displacement of the wall portions relative to each other is enabled that allow demarcation of the processing chamber 45b from the vacuum chamber 2b for different orientations of the object.

The processing chamber wall 35b may be displaced along directions indicated by the double arrow 49 substantially perpendicular to a plane 48 spanned by the beam axis of the electron beam 11b and the ion beam 21b, to withdraw the processing chamber wall 35b from the focussing region. In such a withdrawn state an object at the object holder may for example be replaced or positioned. Further, in this state the processing system may be utilized as a pure inspection system. When an object in the presence of a process gas should be processed by activating the process gas, the withdrawn processing chamber wall 35b is shifted along a direction defined by the double arrow 49 illustrated in FIG. 2c, to partially encompass the focussing region 29b for forming a processing chamber 45b.

The orientations of the object are not restricted to the exemplary orientations illustrated in FIGS. 2a and 2b, but may have other relative angles, such as 10°, 20°, 30°, 40°, 50°, 60°, or values in-between.

Figure 3A:
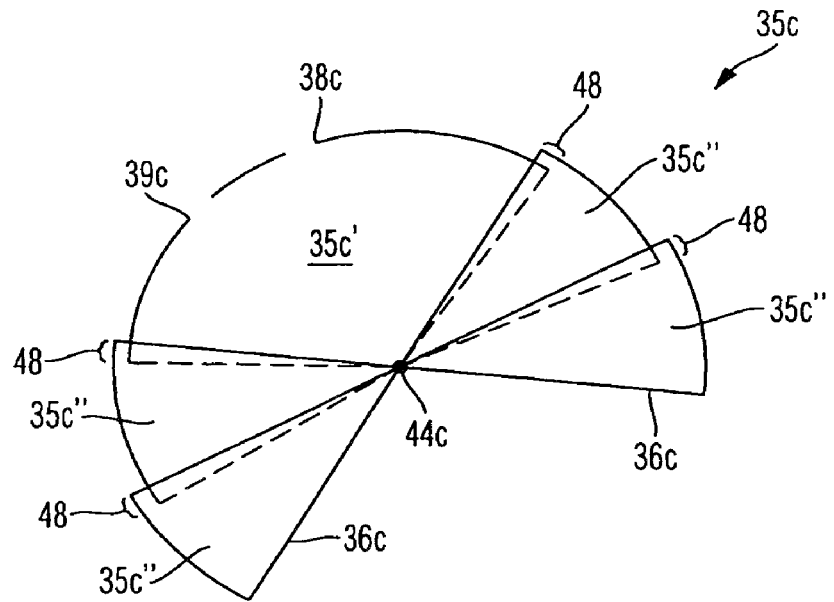
FIGS. 3a and 3b schematically show an embodiment of a processing chamber wall which may be employed in a particle optical processing system shown in FIGS. 1 and 2.
Figure 3B:
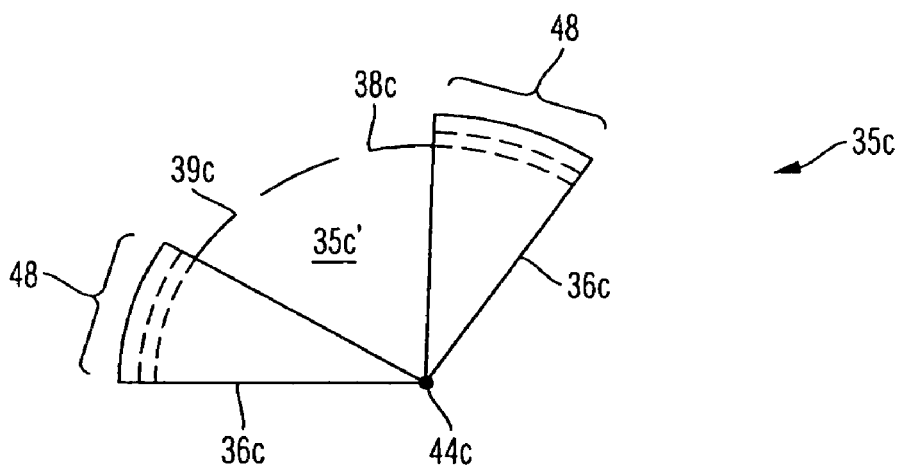

FIGS. 3a and 3b schematically illustrate a processing chamber wall 35c that may be employed in particle optical processing systems. FIGS. 3a and 3b each illustrate front views of the processing chamber wall 35c. The processing chamber wall 35c is formed by a first wall portion 35c' and plural second wall portions 35c". The wall portions 35c" are pivotable relative to the first wall portion 35c' around a pivoting axis 44c, which is perpendicular to the drawing plane of FIGS. 3a and 3b.

FIG. 3a illustrates a state of the processing chamber wall 35c, wherein the different wall portions 35c' and 35c" have relative orientations such that overlap regions 48 between abutting wall portions are relatively small. Thereby, a maximal pivoting range of the object holder is defined. During operation the state illustrated in FIG. 3a does usually not occur.

FIG. 3b schematically illustrates a state, wherein the wall portions 35c" are pivoted relative to the first wall portion 35c' such that they maximally overlap with the first wall portion 35c' in the overlap regions 48. States of different pivoting of the wall portions relative to each other may be adjusted depending on requirements, to provide a processing chamber 45 in a particle optical processing system.

Figure 4A:
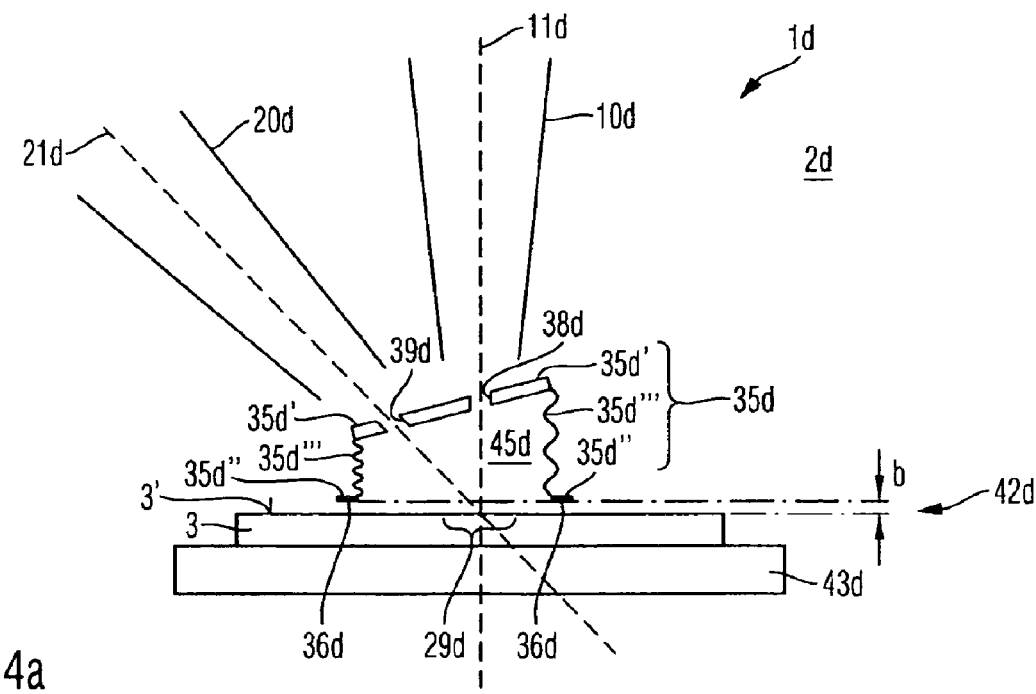
FIGS. 4a and 4b schematically show a further embodiment of a particle optical processing system.
Figure 4B:
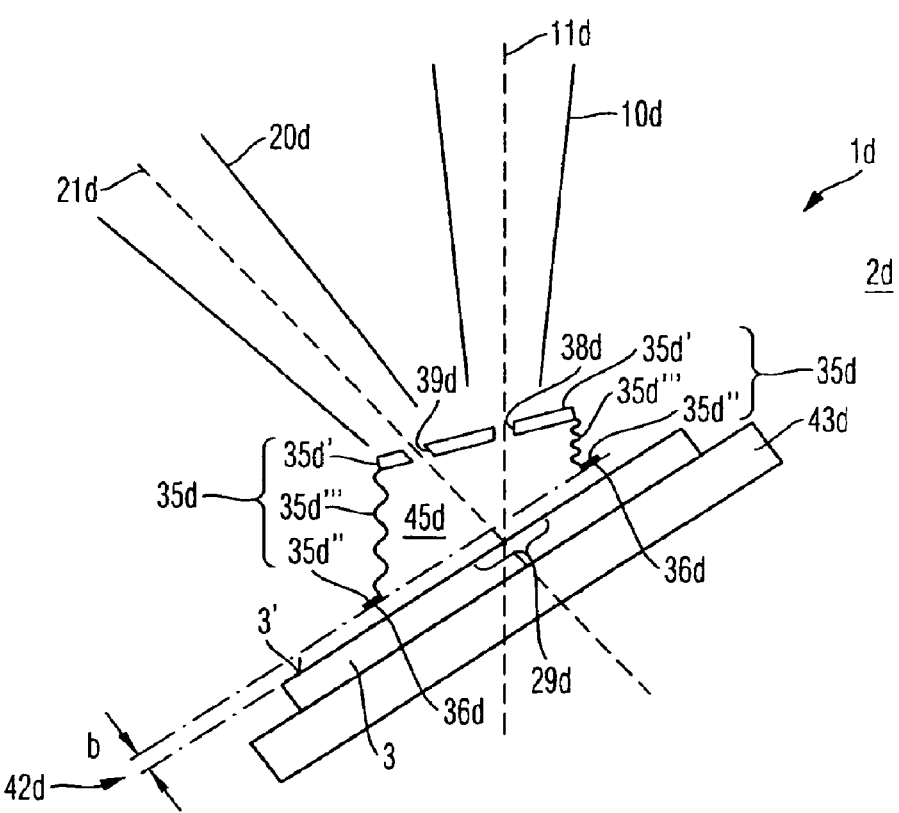

FIGS. 4a and 4b schematically illustrate in a sectional view analogous to the sectional views of the FIGS. 1a, 1b, 2a, and 2b a processing system 1d according to a further embodiment. The processing system 1d has many components in common with the processing systems 1a and 1b illustrated in FIGS. 1a and 1b, and in the FIGS. 2a to 2c, respectively, so that a detailed description of these components may be taken from the description of processing systems 1a and 1b.

The processing system 1d mainly differs from the afore shown processing systems 1a and 1b by the configuration of the processing chamber wall 35d. The processing chamber wall 35d in processing system 1d is formed by a first wall portion 35d', a second wall portion 35d" and a third wall portion 35d'". Thereby, the first wall portion 35d' comprises an opening 38d for traversal of the electron beam lid running inside the electron beam column 10d. The electron beam 11d is incident in the focussing region 29d onto the object 3. The first wall portion 35d' further comprises an opening 39d for traversal of the ion beam 21d running inside the ion beam column 20d. Also the ion beam 21d is incident after traversal through the opening 39d at the focussing region 29d onto the surface 3' of the object 3.

In the illustrated example the second wall portion 35d" comprises a front face 36d of the processing chamber wall 35d which together with the surface 3' of the object 3 forms a gap 42d having a width b of less than 2 mm, in particular less than 200 µm, further in particular less than 20 µm. In other embodiments the front face 36d may abut at the surface 3' of the object 3 such that no gap is formed. The first wall portion 35d' is elastically connected to the second wall portion 35d" via a third wall portion, a bellows 35d'". For example the bellows 35d'" is a conventional bellows made from metal which is for example used in vacuum technology. Instead of using a bellows also a ring structure comprising elastic material may be employed.

FIG. 4a illustrates a state of the processing system 1d in a first orientation of the object 3 relative to the electron beam column 10d, wherein a normal of the surface 3' of the object is substantially aligned parallel to a propagation direction of the electron beam 11d.

In contrast, FIG. 4b schematically illustrates the processing system 1d in a state, wherein the object 3 is aligned in a second orientation relative to the electron beam column 10d such that the normal of the surface 3' of the object is substantially aligned parallel to a propagation direction of the ion beam 21d. Compared to the configuration of the third wall portion 35d'" illustrated in FIG. 4a the third wall portion 35d'" in FIG. 4b is elastically deformed such that the front face 36d comprised in the second wall portion 35d" together with the surface 3' of the object forms a gap 42d having a width b being substantially unchanged compared to the width in the first orientation.

Positions of the openings 38d and 39d in FIG. 4b are substantially unchanged compared to positions of the openings 38d and 39d in FIG. 4a, to allow in both orientations an unhindered traversal of the ion beam and the electron beam to the focussing region 29d. A gas supply not illustrated in the FIGS. 4a and 4b due to the sectional view is adapted, to supply process gas or process gases to the focussing region 29d, so that processing the object may be performed in the presence of process gas. Further, the object may be inspected using the ion beam 21d and/or the electron beam 11d, to determine a progress of the processing.

Figure 5A:
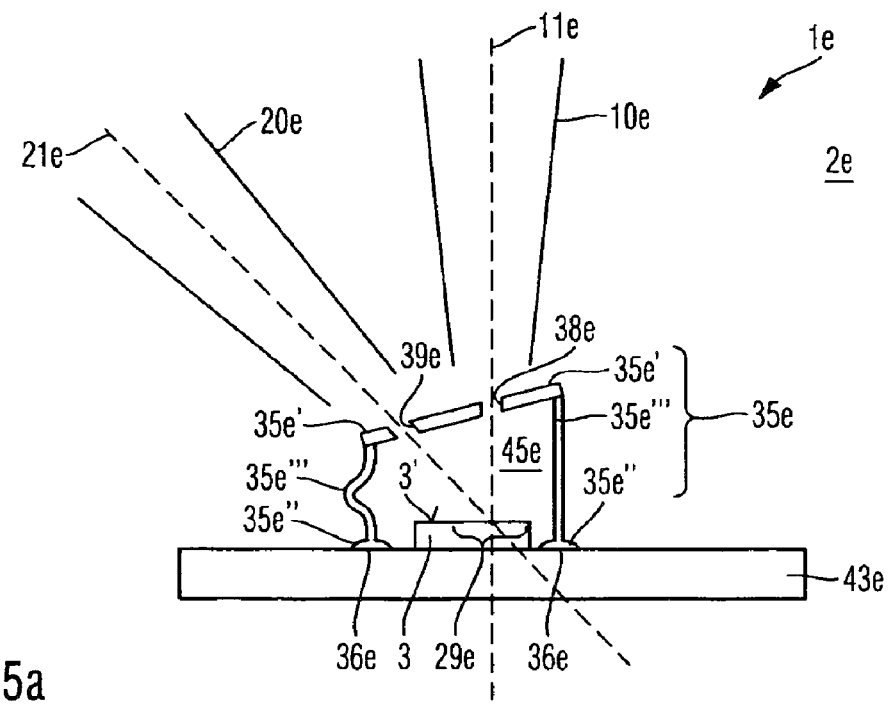
FIGS. 5a and 5b schematically show a still further embodiment of a particle optical processing system.
Figure 5B:
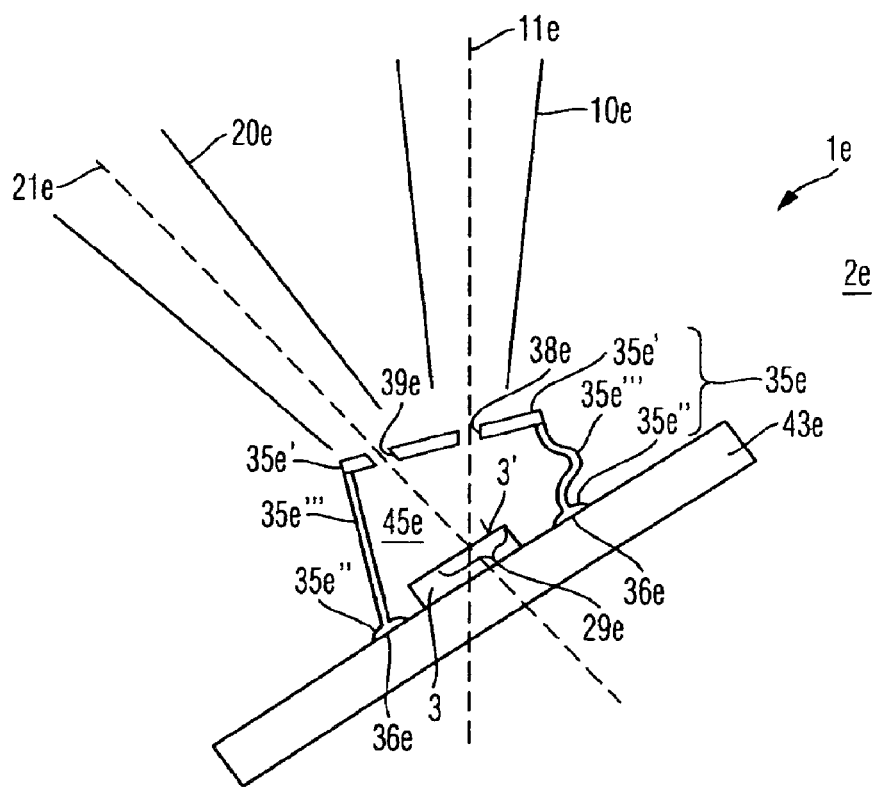

FIGS. 5a and 5b schematically illustrate in the sectional view analogues to the sectional views of the FIGS. 1a, 1b, 2a, 2b, 4a, and 4b a processing system 1e according to a still further embodiment. The processing system 1e has a number of components in common with the processing systems 1a, 1b or 1d illustrated in FIGS. 1a and 1b, 2a to 2c, and 4a and 4b, respectively so that a detailed description of these components may be omitted.

The processing system 1e differs from the afore shown processing systems 1a, 1b, and 1d mainly by the adaptation and configuration of the processing chamber wall 35e and its abutment to the object holder 43e. The processing chamber wall 35e in the processing system 1e is formed by a first wall portion 35e', a second wall portion 35e" and a third wall portion 35e'". Thereby, the first wall portion 35e' comprises an opening 38e for traversal of the electron beam 11e running inside the electron beam column 10e. Further, the first wall portion 35e' comprises an opening 39e for traversal of the ion beam 21e running inside the ion beam column 20e. As the electron beam 11e also the ion beam 21d is incident at the focussing region 29e onto the surface 3' of the object 3.

The second wall portion 35e" annularly surrounds the object 3 and directly abuts at the object holder 43e. The second wall portion 35e" is formed from an elastic material (e.g. elastomer) and forms in the here shown examples a front face 36e of the processing chamber wall 35e which abuts at the object holder 43e. Thus, in this embodiment no gap is formed between the object 3 and the processing chamber wall. Instead, the front face 36e of the processing chamber wall 35e abutting with the object holder 43e and thus being flush with the object holder seals a processing chamber 45e from the vacuum chamber 2e, to thus maintain within the processing chamber 45e a partial pressure of a process gas being increased compared to the partial pressure within the vacuum chamber 2e. This enables advantageously processing the object by activating the process gas using for example the ion beam, the electron beam or a photon beam.

Similar as in the processing chamber wall 35d illustrated in FIGS. 4a and 4b the first wall portion 35e' is elastically connected to the second wall portion 35e" via a third wall portion, here a rubber ring (alternatively a bellows, such as made from metal) 35e'''. The rubber ring 35e''' is elastically deformable and enables a shape change of the processing chamber wall 35e for different orientation of the object 3 relative to the particle beam columns 10e and 20e. For example a part of the rubber ring 35e''' situated in the sectional view of FIG. 4a at the right hand side relative to the particle beam axis is arranged in an elongated conformation while a part of the rubber ring 35e''' situated on the left hand side is adapted in a compressed conformation comprising a bulge. These conformations occur in a reversed way in FIG. 5b showing a state of an orientation of the object which is different from the orientation illustrated in FIG. 5a.

FIG. 5a illustrates a state of the processing system 1e in a first orientation of the object 3 relative to the electron column 10e, wherein a normal of the surface 3' of the object is substantially aligned parallel to a propagation direction of the electron beam 10d.

In contrast, FIG. 5b schematically illustrates the processing system 1e in a state, wherein the object 3 is aligned in a second orientation relative to the electron beam column 10e such that the normal of the surface 3' of the object is substantially aligned parallel to a propagation direction of the ion beam 21e.

Individual elements or portions of the processing chamber wall illustrated in different embodiments may be combined to provide further embodiments of a processing chamber wall that may be employed in processing systems.

For example between the processing chamber wall (in particular between the front face of the processing chamber wall) and the object a gap of substantially same width may be formed in different orientations of the object. Alternatively, the processing chamber wall (in particular the front face of the processing chamber wall) may abut the object or the object holder, wherein in the latter case the processing chamber wall advantageously surrounds the object without contacting it. Thus, a particular effective sealing between the processing chamber and the vacuum chamber may be achieved and at the same time damage of the object may be prohibited.

The processing chamber wall may be formed from one or plural wall portions, wherein the number of the wall portions may be 2, 3, 4, 5, 6 or a higher number. A mechanical and/or electronic controller for maintaining a substantially constant width b of the gap 42 between the front face 36 of the processing chamber wall 35 and the surface 3' of the object 3 may be provided. Further, the processing chamber wall may comprise a third opening for traversal of a third particle beam and/or a light beam (laser beam). Thereby, beside particle beams also a light beam, such as a laser beam, may be incident onto the object surface. This may be advantageous for particular applications, for example for surface heating, for reaction activation or for analysis purposes.

While the invention has been described also with respect to certain specific embodiments thereof, it is evident that many alternatives, modifications and variations will be apparent to those skilled in the art. Accordingly, the preferred embodiments of the invention set forth herein are intended to be illustrative and not limiting in any way. Various changes may be made without departing from the spirit and scope of the present invention as given by the following claims and equivalents thereof.

The invention claimed is:

1. A processing system for processing an object, the processing system comprising:
a first energy beam guiding system having first optics configured for generating a first energy beam and focusing the first energy beam in a focusing region located in a vacuum chamber;
a second energy beam guiding system having second optics configured for generating a second energy beam and focusing the second energy beam in the focusing region;
at least one processing chamber wall which is arrangeable within the vacuum chamber such that the processing chamber wall at least partially encompasses the focusing region;
wherein the processing chamber wall comprises a front face substantially disposed in a plane, wherein the front face surrounds a beam path of the first energy beam and a beam path of the second energy beam;
wherein the processing chamber wall has at least one connector for supplying a process gas to the focusing region;
wherein a first opening traversed by the beam path of the first energy beam is formed in the processing chamber wall;
wherein a second opening traversed by the beam path of the second energy beam is formed in the processing chamber wall, and wherein the second opening is spaced apart from the first opening;
wherein the processing chamber wall comprises a first wall portion and a second wall portion, which are configured to be displaceable relative to each other; and
wherein the processing system is configured such that the displacing of the first and the second wall portions relative to each other changes an inclination of the front face relative to at least one of the beam path of the first energy beam and the beam path of the second energy beam.

2. The processing system according to claim 1, wherein the first energy beam is an electron beam and the second energy beam is an ion beam.

3. The processing system according to claim 1, wherein the first energy beam guiding system comprises an electron beam column, and wherein the second energy beam guiding system comprises an ion beam column.

4. The processing system according to claim 1, wherein the processing chamber wall has a portion extending in a direction transverse to the plane.

5. The processing system according to claim 1, wherein the processing chamber wall further comprises a connector for discharging the process gas from the focusing region.

6. The processing system according to claim 1, wherein in the first and in the second orientation, at least one of the front face and a fitting plane of the front face substantially extends parallel to a surface of the object.

7. The processing system according to claim 1, wherein the second wall portion comprises at least a portion of the front face;
wherein the processing system is configured such that the displacing of the first and the second wall portions relative to each other causes the second wall portion to move relative to the vacuum chamber.

8. The processing system according to claim 7, wherein the processing chamber wall is configured such that the displacing of the first and the second wall portions relative to each other leaves a position of the first opening and a position of the second opening substantially unchanged.

9. The processing system according to claim 1,
wherein the processing system further comprises an object holder for holding the object, wherein the object holder is adapted to change an orientation of the object relative to the beam path of the first energy beam from a first orientation to a second orientation;
wherein an angle between the first orientation and the second orientation is between 10° and 60°; and
wherein a gap is formed between the front face of the processing chamber wall and at least one of the object and the object holder in both the first orientation and the second orientation, wherein for each portion of the front face, the gap has a width of less than 0.5 mm.

10. The processing system according to claim 9, wherein the gap has a width of less than 200 µm.

11. The processing system according to claim 9, wherein the front face of the processing chamber wall lies flush against the at least one of the object and the object holder in both the first orientation and the second orientation.

12. A processing system for processing an object, the processing system comprising:
a first energy beam guiding system having first optics configured for generating a first energy beam and focusing the first energy beam in a focusing region located in a vacuum chamber;
a second energy beam guiding system having second optics configured for generating a second energy beam and focusing the second energy beam in the focusing region;
at least one processing chamber wall which has a recessed shape which opens toward a plane; wherein the processing chamber wall is arrangeable within the vacuum chamber such that the processing chamber wall at least partially encompasses the focusing region;
wherein the processing chamber wall comprises a front face substantially disposed in the plane, wherein the front face surrounds a beam path of the first energy beam and a beam path of the second energy beam;
wherein the processing chamber wall has at least one connector for supplying a process gas to the focusing region;
wherein a first opening traversed by the beam path of the first energy beam is formed in the processing chamber wall, and wherein a second opening traversed by the beam path of the second energy beam is formed in the processing chamber wall, and wherein the second opening is spaced apart from the first opening;
wherein the processing chamber wall comprises a first wall portion and a second wall portion being displaceable relative to each other; and
wherein the first wall portion provides the first opening and the second opening, and wherein the second wall portion comprises at least a portion of the front face.

13. The processing system according to claim 12, wherein the first wall portion and the second wall portion are pivotable relative to each other about an axis.

14. The processing system according to claim 12, wherein the first wall portion and the second wall portion are arranged side by side such that portions of surfaces of the first and second wall portions overlap.

15. The processing system according to claim 12, wherein the first wall portion and the second wall portion are elastically connected to each other by a third wall portion.

16. The processing system according to claim 12, further comprising an object holder for holding the object, wherein the object holder is adapted to change an orientation of the object relative to the beam path of the first energy beam from a first orientation to a second orientation;
wherein an angle between the first orientation and the second orientation is between 10° and 60°.

17. The processing system according to claim 16, wherein the first and the second wall portions are configured such that a gap is formed between the front face of the processing chamber wall and at least one of the object or the object holder in both the first and the second orientation, wherein for each portion of the front face, the gap has a width of less than 0.5 mm.

18. The processing system according to claim 16, wherein the processing chamber wall is configured such that in the second orientation, a position of the first opening and a position of the second opening remain substantially unchanged compared to the first orientation.

19. The processing system according to claim 12, wherein the first energy beam is an electron beam and the second energy beam is an ion beam.

20. The processing system according to claim 12, wherein the first wall portion comprises a connector for discharging the process gas from the focusing region.

21. The processing system according to claim 12, wherein the first wall portion is fixedly connected to at least one of the first energy guiding system and the second energy guiding system.

22. The processing system according to claim 12,
wherein the processing system is configured such that the displacing of the first and the second wall portions relative to each other changes an inclination of the front face relative to at least one of the beam path of the first energy beam and the beam path of the second energy beam.

23. The processing system according to claim 12,
wherein the first and the second wall portions are configured such that a gap is formed between the front face and at least one of the object and the object holder to form a processing chamber within the vacuum chamber;
wherein the processing chamber has an interior space and a surrounding space, which surrounds the processing chamber; and
wherein the gap is located between the interior space of the processing chamber and the surrounding space.

24. The processing system according to claim 23, wherein at least one of the following holds:
(a) for each portion of the front face, the gap has a width of less than 0.5 mm; and
(b) the front face lies flush against the at least one of the object and the object holder.

25. The processing system according to claim 12, wherein the processing chamber wall is configured such that the displacing of the first and the second wall portions relative to each other leaves a position of the first opening and a position of the second opening substantially unchanged.

26. The processing system according to claim 9, wherein the relative displacement causes the second wall portion to move relative to the vacuum chamber.

27. The processing system according to claim 26, wherein the second wall portion comprises the front face.

28. The processing system according to claim 9, wherein the second wall portion comprises the front face.

29. The processing system according to claim 23, wherein the relative displacement causes the second wall portion to move relative to the vacuum chamber.

30. The processing system according to claim 23, wherein the second wall portion comprises the front face.

31. A processing system for processing an object, the processing system comprising:
 a first energy beam guiding system having first optics configured for generating a first energy beam and focusing the first energy beam in a focusing region located in a vacuum chamber;
 a second energy beam guiding system having second optics configured for generating a second energy beam and focusing the second energy beam in the focusing region;
 at least one processing chamber wall which is arrangeable within the vacuum chamber such that the processing chamber wall at least partially encompasses the focusing region;
 wherein the processing chamber wall comprises a front face substantially disposed in a plane, wherein the front face surrounds a beam path of the first energy beam and a beam path of the second energy beam;
 wherein the processing chamber wall has at least one connector for supplying a process gas to the focusing region;
 wherein a first opening traversed by the beam path of the first energy beam is formed in the processing chamber wall, and wherein a second opening traversed by the beam path of the second energy beam is formed in the processing chamber wall, and wherein the second opening is spaced apart from the first opening;
 wherein the processing chamber wall comprises a first wall portion and a second wall portion being displaceable relative to each other, wherein the first wall portion provides the first opening and the second opening, and wherein the second wall portion comprises at least a portion of the front face; and
 an object holder for holding the object, wherein the object holder is adapted to change an orientation of the object relative to the beam path of the first energy beam from a first orientation to a second orientation;
 wherein an angle between the first orientation and the second orientation is between 10° and 60°;
 wherein in the first and in the second orientation, at least one of the front face and a fitting plane of the front face substantially extends parallel to a surface of the object.

32. The processing system according to claim 31, wherein the first wall portion and the second wall portion are pivotable relative to each other about an axis.

33. The processing system according to claim 31, wherein the first wall portion and the second wall portion are arranged side by side such that portions of surfaces of the first and second wall portions overlap.

34. The processing system according to claim 31, wherein the first wall portion and the second wall portion are elastically connected to each other by a third wall portion.

35. The processing system according to claim 31, wherein a gap is formed between the front face of the processing chamber wall and at least one of the object or the object holder in both the first and the second orientation, wherein for each portion of the front face, the gap has a width of less than 0.5 mm.

36. The processing system according to claim 31, wherein the front face of the processing chamber wall lies flush against the at least one of the object and the object holder in both the first orientation and the second orientation.

37. The processing system according to claim 31, wherein the processing chamber wall is configured such that in the second orientation, a position of the first opening and a position of the second opening remain substantially unchanged compared to the first orientation.

* * * * *